United States Patent
Sporer et al.

[11] Patent Number: 5,874,366
[45] Date of Patent: Feb. 23, 1999

[54] METHOD FOR ETCHING A SEMICONDUCTOR SUBSTRATE AND ETCHING SYSTEM

[75] Inventors: Roland Sporer, Hohenpeissenberg; Josef Mathuni; Alexander Gschwandtner, both of München, all of Germany

[73] Assignee: Siemens Aktiengesellschaft, Munich, Germany

[21] Appl. No.: 863,371

[22] Filed: May 27, 1997

[30] Foreign Application Priority Data

May 28, 1996 [DE] Germany ................ 196 21 399.1

[51] Int. Cl.[6] .................................................. H01L 21/00
[52] U.S. Cl. ......................... 438/748; 156/345; 216/91; 216/92; 438/745
[58] Field of Search ................ 156/345 L, 345 LS; 216/91, 92; 438/745, 748, 753, 756

[56] References Cited

U.S. PATENT DOCUMENTS

| 4,350,562 | 9/1982 | Bonü . |
| 4,600,463 | 7/1986 | Aigo ..................................... 438/478 X |
| 4,857,142 | 8/1989 | Syverson . |

FOREIGN PATENT DOCUMENTS

| 0 444 714 A1 | 9/1991 | European Pat. Off. . |
| 0 609 069 A1 | 8/1994 | European Pat. Off. . |
| 0 668 609 A2 | 8/1995 | European Pat. Off. . |
| 38 11 068 C2 | 7/1995 | Germany . |
| 195 92 777 A1 | 8/1995 | Germany . |

OTHER PUBLICATIONS

"Spin Etcher for Removal of Backside Depositions" (Gaulhofer), 400 Solid State Technology, vol. 34, No. 5, May 1991, pp. 57–58 and 219.
Japanese Patent Abstract No. 3–6823 (Kamibayashi), dated Jan. 14, 1991.
Japanese Patent Abstract No. 2–94435 (Miyamoto), dated Sep. 29, 1988.

*Primary Examiner*—William Powell
*Attorney, Agent, or Firm*—Herbert L. Lerner; Laurence A. Greenberg

[57] ABSTRACT

The method and system of the invention allow etching even relatively thick layers on the rear side of a semiconductor substrate where the front side is resist-free. An etching solution is sprayed in fine droplets onto the rear side of the semiconductor substrate. The semiconductor substrate may thereby be heated to a temperature $\leq 100°$ C.

11 Claims, 1 Drawing Sheet

METHOD FOR ETCHING A SEMICONDUCTOR SUBSTRATE AND ETCHING SYSTEM

BACKGROUND OF THE INVENTION

1. Field of the Invention

The invention relates to a method for etching a rear side of a semiconductor substrate having a resist-free front side, and an etching system suitable therefor.

2. Description of the Related Art

There has become known from German patent publication DE-A19502777.9 (U.S. application Ser. No. 08/764,703) a method and a device, in which the layers on the rear side of the semiconductor substrate which are to be removed can be etched with a microwave-excited or RF-excited chemical down-stream method with the use of compounds that contain fluorine. A disadvantage with this method is that thick thermal oxide layers cannot be removed because of the insufficient etching rates.

SUMMARY OF THE INVENTION

It is accordingly an object of the invention to provide a method of etching a semiconductor substrate and a corresponding etching plant, which overcomes the above-mentioned disadvantages of the heretofore-known devices and methods of this general type and which allows the efficient removal of even thick oxide layers, in particular thick thermal oxide layers.

With the foregoing and other objects in view there is provided, in accordance with the invention, a method for etching a rear side of a semiconductor substrate having a resist-free front side, which comprises the following steps:

a) introducing a semiconductor substrate with a resist-free front side and a rear side into a process chamber;

b) flowing a protective gas over the front side of the semiconductor substrate;

c) spraying etching solution onto the rear side of the semiconductor substrate, and removing etching products and excess etching-solution.

By introducing this "quasi-dry" method, even relatively thick layers can be removed economically.

In accordance with an added mode of the invention, the semiconductor substrate and/or the chamber is heated to a temperature of $\leq 100°$ C. This ensures that the etching solution can chemically react well with the layer to be removed on the rear side of the semiconductor substrate, and no drops of etching solution are formed on the semiconductor substrate or on the walls of the process chamber. Further cleaning of the semiconductor substrate and the chamber can be omitted.

With the above and other objects in view there is further provided, in accordance with the invention, an etching system for etching the rear side of a semiconductor substrate having a resist-free front side, comprising:

a) an etching reactor defining a process chamber receiving a semiconductor substrate;

b) wherein the semiconductor substrate received in the process chamber divides the process chamber into a first process-chamber portion, containing a resist-free front side of the semiconductor substrate, and a second process-chamber portion, containing a rear side of the semiconductor substrate;

c) the first process-chamber portion communicating with a protective-gas inlet issuing into the process chamber for feeding protective gas onto the resist-free front side of the semiconductor substrate and for protecting the resist-free front side against etching attack; and d) an etching-solution atomizer communicating with the second process-chamber portion for spraying etching solution onto the rear side of the semiconductor substrate.

In accordance with an additional feature of the invention, there are provided means for heating at least one of the semiconductor substrate and the process chamber. A suitable device for heating the system is a heat lamp. Moreover, however, it is also possible to heat the semiconductor substrate by means of heat transfer through the protective gas to the semiconductor substrate. For this reason, a temperature of about 100° C. has proved particularly suitable because excess etchant droplets, on reaching the vicinity of the semiconductor substrate, then immediately vaporize and thus the semiconductor substrate and the process chamber are dry immediately after the etching has ended.

In accordance with again an additional feature of the invention, there is provided a suction device or evacuation device communicating with an annular gap formed in the process chamber in vicinity of an edge of the semiconductor substrate. Accordingly, the etching products and excess etchant are removed immediately from the area where they are formed.

In accordance with again a further feature of the invention, there is provided a retaining device disposed in the second process-chamber portion for supporting the semiconductor substrate. The preferred retaining device includes at least three pins on which the rear side of the semiconductor substrate rests.

In accordance with yet an additional feature of the invention, there is provided a head plate disposed in the first process-chamber portion above the front side of the semiconductor substrate, the head plate having at least one opening formed therein through which the protective gas flows towards the front side of the semiconductor substrate. The at least one opening formed in the head plate is preferably a central opening centrally above the semiconductor substrate. On the one hand it is ensured that the semiconductor substrate is supported securely in the process chamber, without covering relatively large parts of the rear side of the semiconductor substrate that is to be etched. On the other hand it is ensured that the protective gas flows properly over the front side of the semiconductor substrate.

In accordance with again another feature of the invention, the etching reactor is a multi-chamber reactor with a plurality of etching chambers. The introduction and the withdrawal of the semiconductor substrate to be etched may be fully automated in such a multi-chamber system, and other subsequent or preceding process steps may also take place directly within this multi-chamber system.

Finally, in accordance with a concomitant feature of the invention, there is provided a method of etching a thermal oxide layer from a rear side of a semiconductor substrate having a resist-free front side; the method comprises: exposing the rear side of the semiconductor substrate to an aqueous etching solution which contains up to 50% by weight of hydrofluoric acid and etching the thermal oxide layer.

Other features which are considered as characteristic for the invention are set forth in the appended claims.

Although the invention is illustrated and described herein as embodied in a method of etching a semiconductor substrate and a corresponding etching system, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The sole figure of the drawing is a schematic side elevational view of the device according to the invention.

DESCRIPTION OF THE PREFERRED EMBODIMENTS

Figure 1:
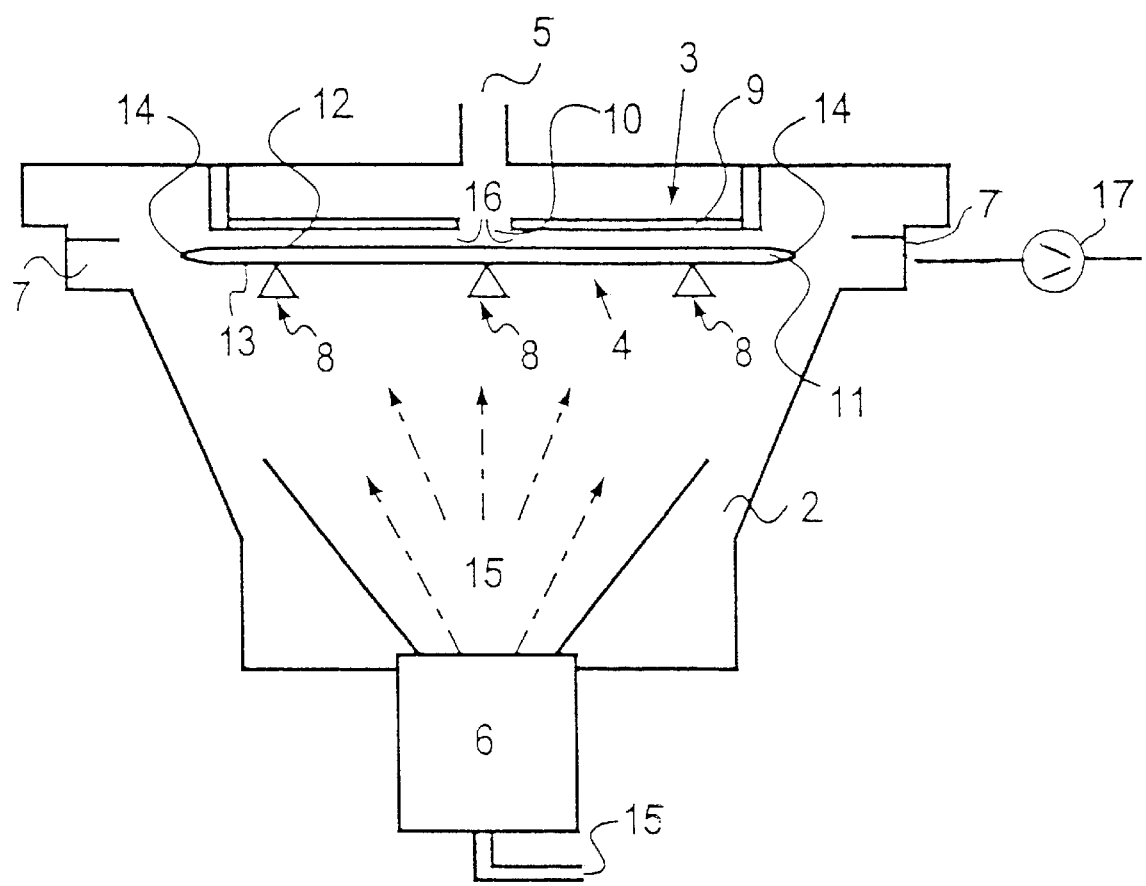

Referring now to the figures of the drawing in detail and first, particularly, to FIG. 1 thereof, an etching system according to the invention comprises an evacuation device 17 which communicates with an etching reactor defining a process chamber 2.

A semiconductor substrate 11, having a rear side 13 and a resist-free front side 12, is placed and supported in the process chamber 2.

In the present illustrative embodiment, the resist-free front side 12 of the semiconductor device has its face pointing upward, i.e. it has been introduced into the process chamber in its natural position.

The process chamber 2 is divided, by the semiconductor substrate 11, into a first process-chamber portion 3, containing the front side 12 of the semiconductor substrate, and a second process-chamber portion 4, containing the rear side 13 of the semiconductor substrate.

In the second process-chamber portion 4 there is provided a retaining device which consists of three pins 8 and on which the rear side 13 of the semiconductor substrate rests.

A head plate 9 is disposed in the first process-chamber portion 3. The head plate 9 is formed with a central opening 10 centrally above the front side 12 of the semiconductor device.

A protective gas inlet 5 opens into the process-chamber portion 3 from above. Protective gas 16 which enters at the inlet 5 flows through the opening 10 and onto the resist-free front side 12 of the semiconductor substrate and protects it from etching attack.

An etching-solution atomizer 6 is disposed below the second process-chamber portion 4. The atomizer 6 sprays etching solution 15 in the form of fine droplets onto the rear side 13 of the semiconductor substrate.

The etching products which are formed during the actual etching process, as well as excess etching solution, are aspirated off through an annular gap 7 formed at the same level with an edge 14 of the semiconductor substrate. The necessary evacuation vacuum is provided by the diagrammatically indicated evacuation device 17 which communicates with the annular gap 7.

The semiconductor substrate 11 is heated to a temperature of about 100° C. by heat transfer from the protective gas 16. In the present case, the layer on the rear side of the semiconductor substrate which is to be removed is a thick thermal $SiO_2$ layer, and the etching solution 15 employed is primarily an aqueous solution that contains about 50% by weight hydrofluoric acid (HF). The etching solution 15 is then sprayed from below in fine droplets onto the heated semiconductor substrate during the etching of this $SiO_2$ layer. The etching solution reacts there with the $SiO_2$ on the rear side 13 of the semiconductor substrate and, together, etching product, water and excess hydrofluoric acid vaporize on the hot semiconductor substrate 11 and are then withdrawn out via the annular gap 7.

Nitrogen is used as protective gas 16 in the present case. It is, however, also possible to use argon or other inert gases. Since the actual etching reaction takes place at relatively high temperatures, the etching is residue-free, particularly when alcohol is added to the etching solution.

We claim:

1. A method for etching a rear side of a semiconductor substrate having a resist-free front side, which comprises the following steps:

a) introducing a semiconductor substrate with a resist-free front side and a rear side into a process chamber;

b) flowing a protective gas over the front side of the semiconductor substrate;

c) spraying etching solution onto the rear side of the semiconductor substrate, and removing etching products and excess etching-solution.

2. The method according to claim 1, which comprises heating the semiconductor substrate to a temperature of $\leq 100°$ C.

3. An etching system for etching a rear side of a semiconductor substrate having the rear side and a resist-free front side, comprising:

a) an etching reactor defining a process chamber receiving a semiconductor substrate;

b) wherein the semiconductor substrate received in the process chamber divides the process chamber into a first process-chamber portion, containing a resist-free front side of the semiconductor substrate, and a second process-chamber portion, containing a rear side of the semiconductor substrate;

c) said first process-chamber portion communicating with a protective-gas inlet issuing into said process chamber for feeding protective gas onto the resist-free front side of the semiconductor substrate and for protecting the resist-free front side against etching attack; and d) an etching-solution atomizer communicating with said second process-chamber portion for spraying etching solution onto the rear side of the semiconductor substrate.

4. The etching system according to claim 3, including means for heating at least one of the semiconductor substrate and said process chamber.

5. The etching system according to claim 3, wherein the semiconductor substrate has an edge, and including a suction device communicating with an annular gap formed in said process chamber in vicinity of the edge of the semiconductor substrate.

6. The etching system according to claim 3, which further comprises a retaining device disposed in said second process-chamber portion for supporting the semiconductor substrate.

7. The etching system according to claim 6, wherein said retaining device includes at least three pins.

8. The etching system according to claim 3, which further comprises a head plate disposed in said first process-chamber portion above the front side of the semiconductor substrate, said head plate having at least one opening formed therein through which the protective gas flows towards the front side of the semiconductor substrate.

9. The etching system according to claim 8, wherein said at least one opening formed in said head plate is a central opening centrally above the semiconductor substrate.

10. The etching system according to one claim 3, wherein said etching reactor is a multi-chamber reactor defining a plurality of etching chambers.

11. A method of etching a thermal oxide layer from a rear side of a semiconductor substrate having a resist-free front side, which comprises: exposing the rear side of the semiconductor substrate to an aqueous etching solution which contains up to 50% by weight of hydrofluoric acid and etching the thermal oxide layer.

* * * * *